United States Patent
Mallett et al.

(10) Patent No.: US 9,564,914 B1
(45) Date of Patent: Feb. 7, 2017

(54) SYSTEMS AND METHODS FOR MONITORING AND COMPENSATION OF ANALOG TO DIGITAL CONVERTER REFERENCE VOLTAGES

(71) Applicant: Schweitzer Engineering Laboratories, Inc., Pullman, WA (US)

(72) Inventors: Travis C. Mallett, Pullman, WA (US); Ben M. Armstrong, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/079,521

(22) Filed: Mar. 24, 2016

(51) Int. Cl.
  *H03M 1/10* (2006.01)
  *H03M 1/34* (2006.01)
(52) U.S. Cl.
  CPC ............ *H03M 1/1009* (2013.01); *H03M 1/34* (2013.01)
(58) Field of Classification Search
  None
  See application file for complete search history.

(56) References Cited

U.S. PATENT DOCUMENTS

| | | | |
|---|---|---|---|
| 4,470,303 A | 9/1984 | O'Donnell | |
| 5,151,866 A * | 9/1992 | Glaser | G01R 21/133 324/141 |
| 7,286,068 B2 | 10/2007 | Stanley | |
| 7,557,572 B1 | 7/2009 | Hertz | |
| 7,728,575 B1 * | 6/2010 | Ozalevli | G05F 3/30 323/313 |
| 8,330,437 B1 | 12/2012 | Hartman | |
| 8,736,468 B2 * | 5/2014 | Fabregas | H03M 1/12 341/118 |

OTHER PUBLICATIONS

Siemens, Siprotec 5: Modular Hardware Design, 03 Hardware Overview SIPROTEC 5/DIGSI 5 Basic Course, Siemens Power Academy TD, Version: D_02D_p. 26, Jan. 2012.
Etzel, M.; Jenkins, W., "Redundant residue number systems for error detection and correction in digital filters," Acoustics, Speech and Signal Processing, IEEE Transactions on , vol. 28, No. 5, pp. 538,545, Oct. 1980. URL: http://ieeexplore.ieee.org/stamp/stamp.jsp?tp=&amumber=1163442&isnumber=26148.

(Continued)

*Primary Examiner* — Howard Williams
(74) *Attorney, Agent, or Firm* — Justin K. Flanagan

(57) ABSTRACT

The present disclosure provides systems and methods for identifying changes in and failures of a reference voltage of an analog to digital (A/D) converter. A non-scalar function of the reference voltage of the A/D converter can be determined and output to the A/D converter. The A/D converter is configured to output a digital value to the A/D conversion system, wherein the digital value corresponds to the non-scalar function of the reference voltage. The A/D conversion system decodes the non-scalar function of the reference voltage with a corresponding inverse function, and may determine the drift factor associated with the reference voltage. The A/D conversion system can report a change in, or a failure of, the A/D converter or its reference voltage, and can operate or prevent operation of protection elements.

21 Claims, 13 Drawing Sheets

(56) References Cited

OTHER PUBLICATIONS

Singh, M.; Koren, I., "Fault-sensitivity analysis and reliability enhancement of analog-to-digital converters," Very Large Scale Integration (VLSI) Systems, IEEE Transactions on , vol. 11, No. 5, pp. 839,852, Oct. 2003. URL: http://ieeexplore.ieee.org/stamp/stamp.jsp?tp=&amumber=1234403&isnumber=27663.
Willsky, Alan S. "A survey of design methods for failure detection in dynamic systems." Automatica 12.6 (1976): 601-611. URL: http://www.sciencedirect.com/science/article/pii/0005109876900418.

* cited by examiner

SYSTEMS AND METHODS FOR MONITORING AND COMPENSATION OF ANALOG TO DIGITAL CONVERTER REFERENCE VOLTAGES

TECHNICAL FIELD

This disclosure relates to validation and measurement systems and methods in electric power delivery systems. More particularly, this disclosure relates to systems and methods for monitoring voltages associated with analog to digital converters.

BRIEF DESCRIPTION OF THE DRAWINGS

Non-limiting and non-exhaustive embodiments of the disclosure are described herein, including various embodiments of the disclosure with reference to the figures listed below.

Figure 1A:
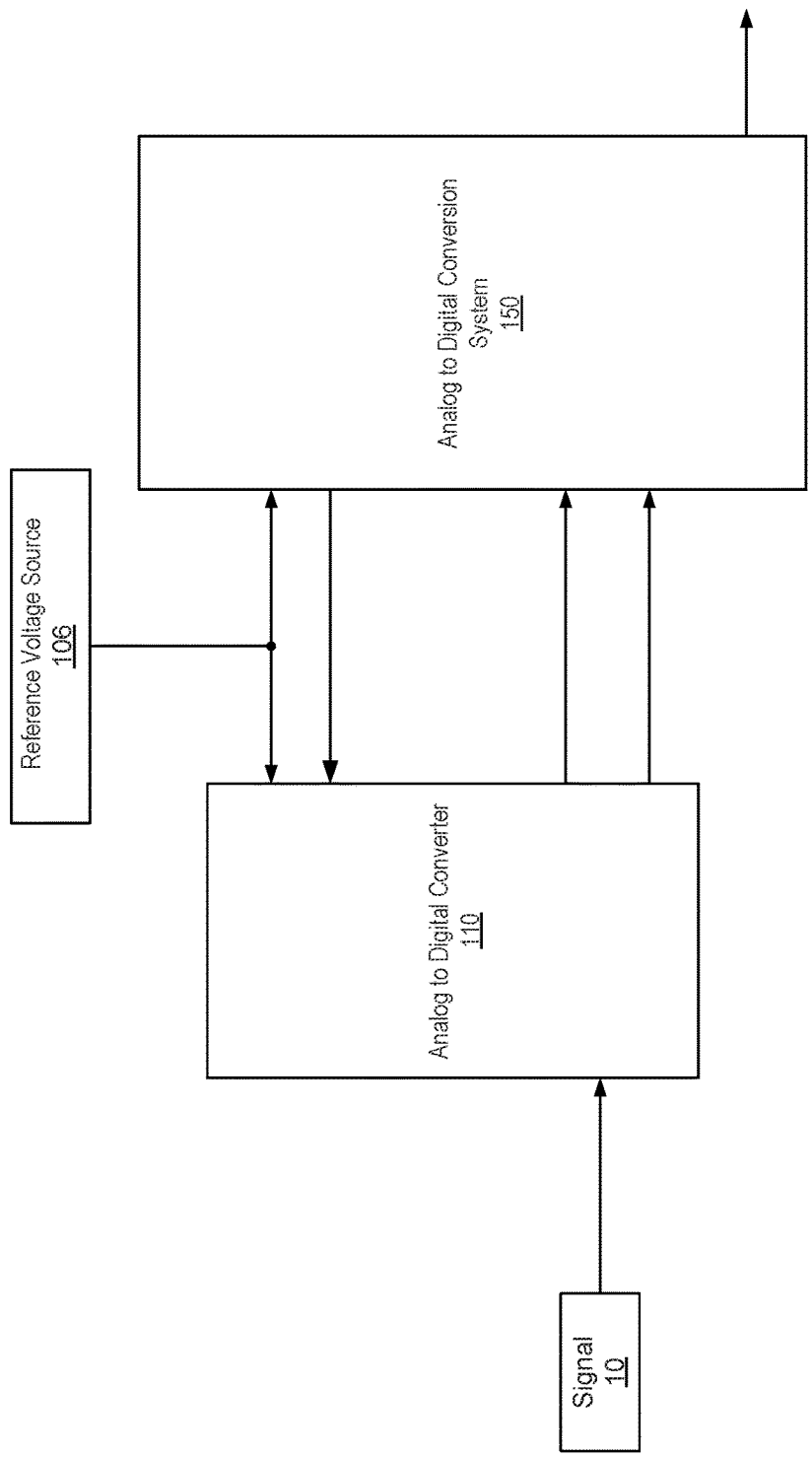
FIG. 1A illustrates an analog to digital conversion system according to one embodiment.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

This disclosure provides methods and systems to enable an analog to digital (A/D) conversion system to detect, measure, report, and/or communicate: a change in a reference voltage (e.g., an operating reference voltage); a change in a ratio of two reference voltage values; one or more reference voltages or a ratio thereof exceeding a determined reference voltage value limit; at least one reference voltage status. The system may scale or otherwise adjust an output based on a change in the reference voltage.

More specifically, an A/D conversion system may include a calibrated reference module to identify a calibrated voltage reference value, $V_{refCAL}$, associated with an A/D converter. The calibrated voltage reference value, $V_{refCAL}$, may correspond to an ideal or anticipated reference voltage of the A/D converter. Thus, the calibrated reference module may determine an expected value of a reference voltage of the A/D converter. Any of a wide variety of A/D converters may be utilized, including bipolar delta-sigma A/D converters.

Additionally, an A/D conversion system may include a non-scalar module to receive a reference voltage, $V_{ref}$, corresponding to the calibrated reference voltage value, $V_{refCAL}$, multiplied by a drift factor, $\alpha$, such that, $V_{ref} = \alpha V_{refCAL}$. Stated differently, the reference voltage, $V_{ref}$, may deviate from the calibrated reference voltage, $V_{refCAL}$, by a drift factor, $\alpha$, and be received by the non-scalar module. The reference voltage, $V_{ref}$, may drift, increase, decrease, or otherwise deviate from the calibrated reference voltage value, $V_{refCAL}$. The non-scalar module may output a non-scalar function of the reference voltage, $N(V_{ref})$, to the A/D converter.

The A/D converter may output a first digital value, $V_{dig}$. The first digital value, $V_{dig}$, may correspond to the non-scalar function of the reference voltage, $N(V_{ref})$, received by the A/D converter. The first digital value, $V_{dig}$, may correspond to a ratio of the calibrated voltage reference value, $V_{refCAL}$, and the reference voltage, $V_{ref}$. Accordingly, the first digital value, $V_{dig}$, can be expressed as the non-scalar function of the product of the calibrated reference voltage and the drift factor, the output of the non-scalar function divided by the drift factor, such that:

$$V_{dig} = \frac{N(\alpha V_{ref})}{\alpha} \quad \text{Equation 1}$$

A drift factor module may be included in the A/D conversion system, to identify an inverse function of the non-scalar function, and to calculate the drift factor, $\alpha$, based on the determined inverse function of the first digital value, $V_{dig}$. The drift factor module may calculate the drift factor, $\alpha$, to facilitate a determination of any changes in the reference voltage, $V_{ref}$.

The A/D conversion system may include an A/D adjustment module or just adjustment module to adjust at least one voltage value associated with the A/D converter using the calculated drift factor, $\alpha$. The adjusted voltage value may compensate for drift of the reference voltage, and represent a more accurate value than the unadjusted voltage value (e.g., an improper reading of the A/D converter following reference voltage drift).

For many power protection and monitoring systems, reliably measuring a precision voltage reference for reporting, monitoring, or detecting out-of-tolerance failures may be difficult without introducing costly additional hardware.

Many embodiments of an A/D converter are incapable of measuring a reference voltage corresponding to the same A/D converter. Further, for many A/D converters, measuring a reference voltage with the same A/D converter merely compares the reference voltage with itself, preventing any detection of a change in the reference voltage of the A/D converter. Previous solutions to this problem are costly, complex, and/or incomplete.

The systems and methods disclosed herein may be adapted to interface with or be included as part of a protection element, such as a power system protection relay. Such protection relays may be configured to communicate with, control, operate, energize, de-energize, and/or disengage one or more power system components. Protection relays may be installed in electric power transmission and distribution facilities to detect overloads, short circuits, and other fault conditions.

A protective relay may be configured to detect a fault condition (e.g., a short circuit fault) based on an overcurrent element associated with a specific amount of current and may trip a breaker, clearing the fault. In some embodiments, protective relays may be deemed "mission critical" equipment for the integrity of the power system and personal safety of the users and operators. In many embodiments and configurations of a protective relay, the reliability and proper function of a protective relay may be of utmost concern.

Many embodiments of a protective relay are electronic devices employing FPGAs, microcontrollers, CPUs, A/D converters, electronic displays, communication ports, and other electronic devices and systems to digitize power system current and/or voltage measurements, and process data associated with the digitized currents and voltages according to various algorithms and/or digital filters. A protective relay may be configured to make protection decisions based on data associated with a digitized power system's currents and/or voltages, and may communicate decisions made by a protective relay to an appropriate system or personnel, and/or may otherwise cause a suitable response to the digitized power system's currents and/or voltages.

Decisions made by a protective relay may only be as reliable as any digitized current and/or voltage data communicated to the protective relay from an A/D converter. If an A/D converter communicates false or inaccurate information to a protective relay without any indication of one or more errors associated with the communicated information (e.g., errors associated with unexpected changes in a reference voltage), the protective relay may act based on the received false or inaccurate data, and may cause unintended consequences known as an "unintended operation" (UO).

Some embodiments of an A/D conversion system described herein may interface with and/or be included as part of an intelligent electronic device (IED), which may be used for monitoring, protecting, and/or controlling industrial and utility equipment, such as in electric power delivery systems. IEDs within an A/D conversion system may be configured to perform metering, control, and protection functions that require a certain level of accuracy. Further, IEDs may be configured to obtain measurement information from A/D converters, and may be configured to identify any potential failures of an A/D converter from which the IED is receiving data. Specifically, a reference voltage of a measurement device, such as an A/D converter, may be monitored and/or validated on a regular basis (e.g., at predetermined time periods or in response to a specific event) to ensure that it is functioning correctly and/or that any failure of the A/D converter is identified and/or reported. Specifically, a reference voltage associated with an A/D converter may be monitored and/or validated in response to other events and/or at specific time intervals. Any errors or abnormalities can then be identified and reported.

The IED may utilize a common time source, such as a time signal provided by a global positioning system (GPS) or via a time-synchronizing standard such as IEEE 1588 to time-align the collected measurement data. Accordingly, the IED may be time-aligned to allow for synchrophasors to be calculated. Additionally, the IED may utilize identical or similar sampling and processing algorithms for the collected measurement data of several A/D converters to further facilitate the calculations of accurate synchrophasors.

However, in many situations, the IED may utilize unsynchronized time signals and/or alternative sampling and processing algorithms for the collected data of one or more A/D converters. For example, a system may include any number of A/D converters that are different models and/or utilize independent time signals. In such embodiments, the data collected may not be inherently time-aligned. If different model A/D converters are used and/or the converters are not time-aligned, then an event trigger common to both A/D converters may be used to align the measurement data from each converter. For example, each A/D converter may be configured to begin collecting data when a power system event or anomaly is detected, such as when an overcurrent is detected.

An A/D conversion system may include a single IED to monitor a particular A/D converter. In other embodiments, the input of the single IED may be time-synchronized with some synchronous signal as described above. In still other embodiments of an A/D conversion system, two or more IEDs may be configured to monitor the same A/D converter. The collected measurement data of the two or more IEDs may be synchronized using any of a wide variety of methods and approaches, including those previously described.

A first IED and a second IED may function as primary and backup IEDs, respectively. The first IED and the second IED may function as dual-primary IEDs. Any number of IEDs may be used in conjunction with the validation systems and methods described herein. For example, three or four IEDs may be utilized to validate one another in a primary-backup combination or as a plurality of primary IEDs.

The systems and methods described herein may be expanded for use in an enterprise and/or industrial environment in which a validation module or validation device may be in communication with any number (i.e., hundreds or even thousands) of pairs of IEDs functioning in dual-primary or primary-backup configurations. Accordingly, a centralized validation system may be capable of remotely validating the functionality of measurement devices and/or IEDs throughout an electric power delivery system. Similarly, a validation module or validation device may be adapted to monitor and regularly validate the functionality of measurement devices and/or IEDs within a substation of an electric power delivery system.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term IED may refer to any microprocessor-based device that monitors, controls, automates, and/ or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, Field Programmable Gate Array (FPGA), or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer-executable code located within or on a computer-readable storage medium. A software module may, for instance, comprise one or more physical or logical blocks of computer instructions, which may be organized as a routine, program, object, component, data structure, etc., that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

Figure 1B:
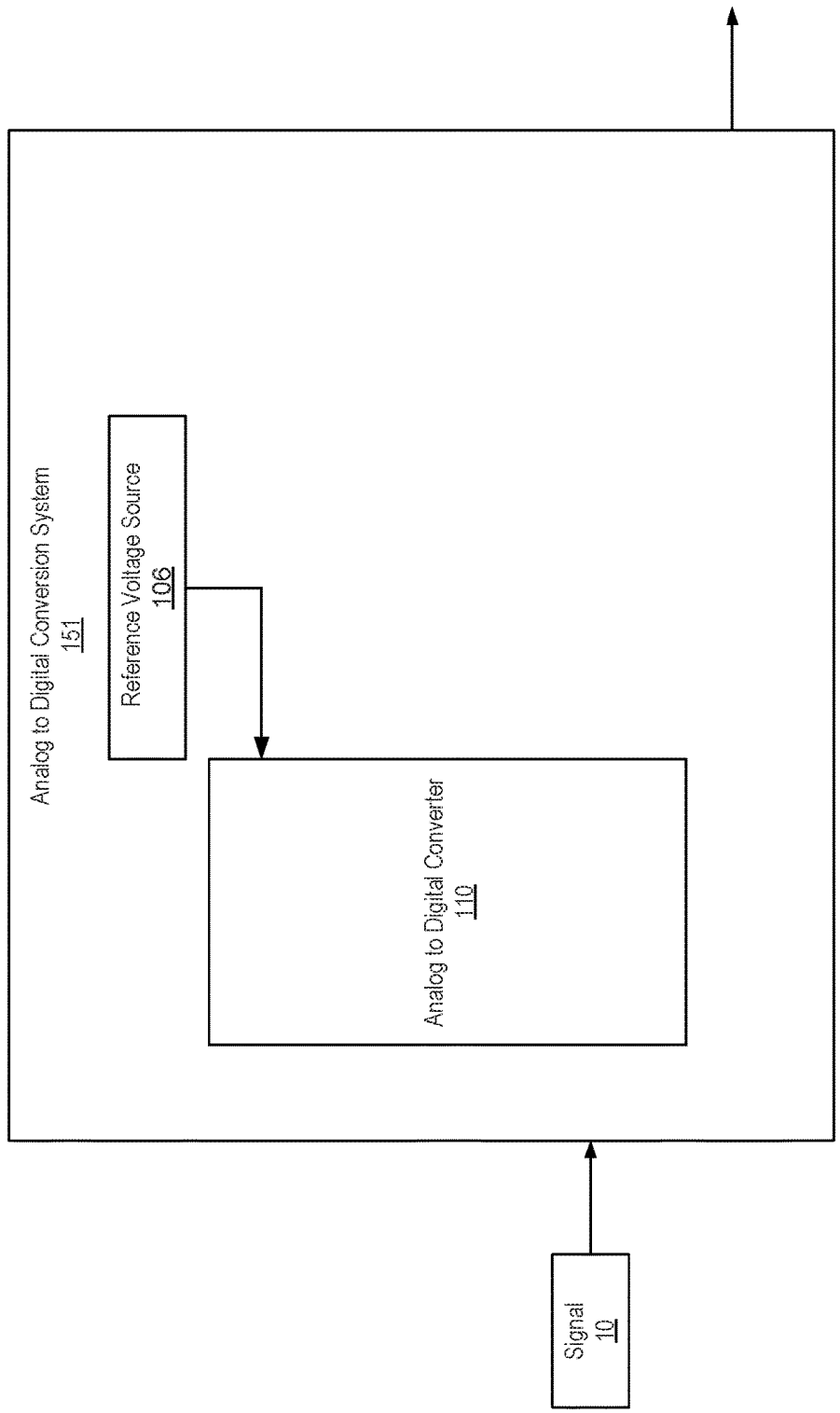
FIG. 1B illustrates an analog to digital conversion system according to one embodiment.
Figure 1C:
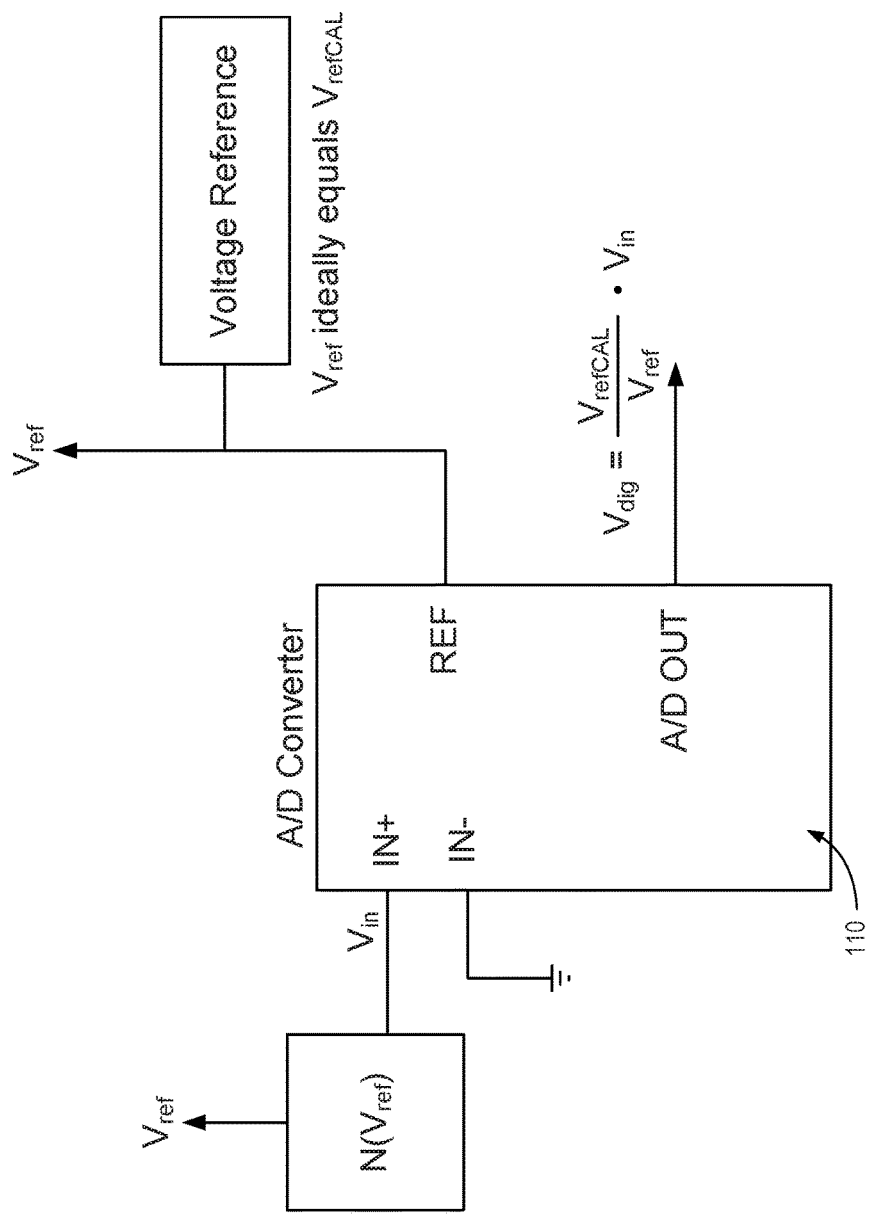
FIG. 1C illustrates an analog to digital conversion system according to one embodiment.
Figure 1D:
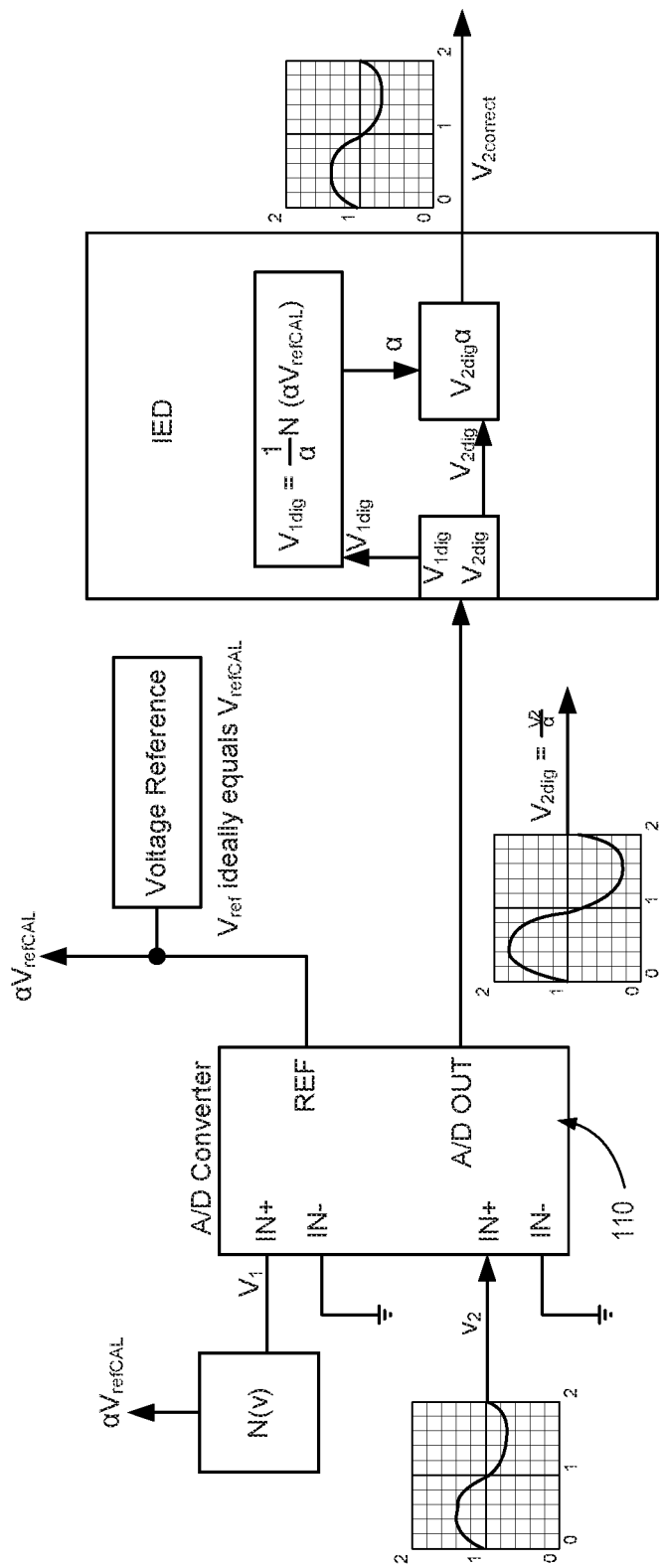
FIG. 1D illustrates an analog to digital conversion system according to one embodiment.

FIG. 1A illustrates an A/D converter 110 in communication with an A/D conversion system 150, according to one embodiment. FIG. 1B illustrates the A/D converter 110 integrated as part of an A/D conversion system 151, according to one embodiment of the present disclosure. FIG. 1C illustrates an A/D conversion system according to yet another embodiment of the present disclosure. FIG. 1D illustrates yet another embodiment of an A/D conversion system. With reference to FIGS. 1A-1D generally and collectively, an A/D converter 110 may be configured as a component in communication with any other number of discrete components of an A/D conversion system, such as in FIGS. 1A, 1C, and 1D. As illustrated, an A/D converter 110 may be a module or component of a set of discrete components or a module or component of an integrated system.

Reference below is made with respect to FIG. 1A, however it will be appreciated that the description can be adapted for applicability to any of FIGS. 1B-1D by one of skill in the art. As illustrated in FIG. 1A, the A/D converter 110 may sample a signal 10 and receive a reference voltage, $V_{ref}$, from a reference voltage source 106. The reference voltage, $V_{ref}$, may correspond to a calibrated reference voltage value, $V_{refCal}$. The A/D converter 110 and the A/D conversion system 150 may be configured to detect and operate according to a drift factor of $V_{ref}$ which may correspond to a ratio of $V_{ref}$ and $V_{refCal}$. The A/D conversion system 150 may determine an adjusted operating reference voltage and output the adjusted operating reference voltage to the A/D converter 110. The A/D converter 110 may be configured to output a corresponding digital value to the A/D conversion system 150.

Figure 2A:
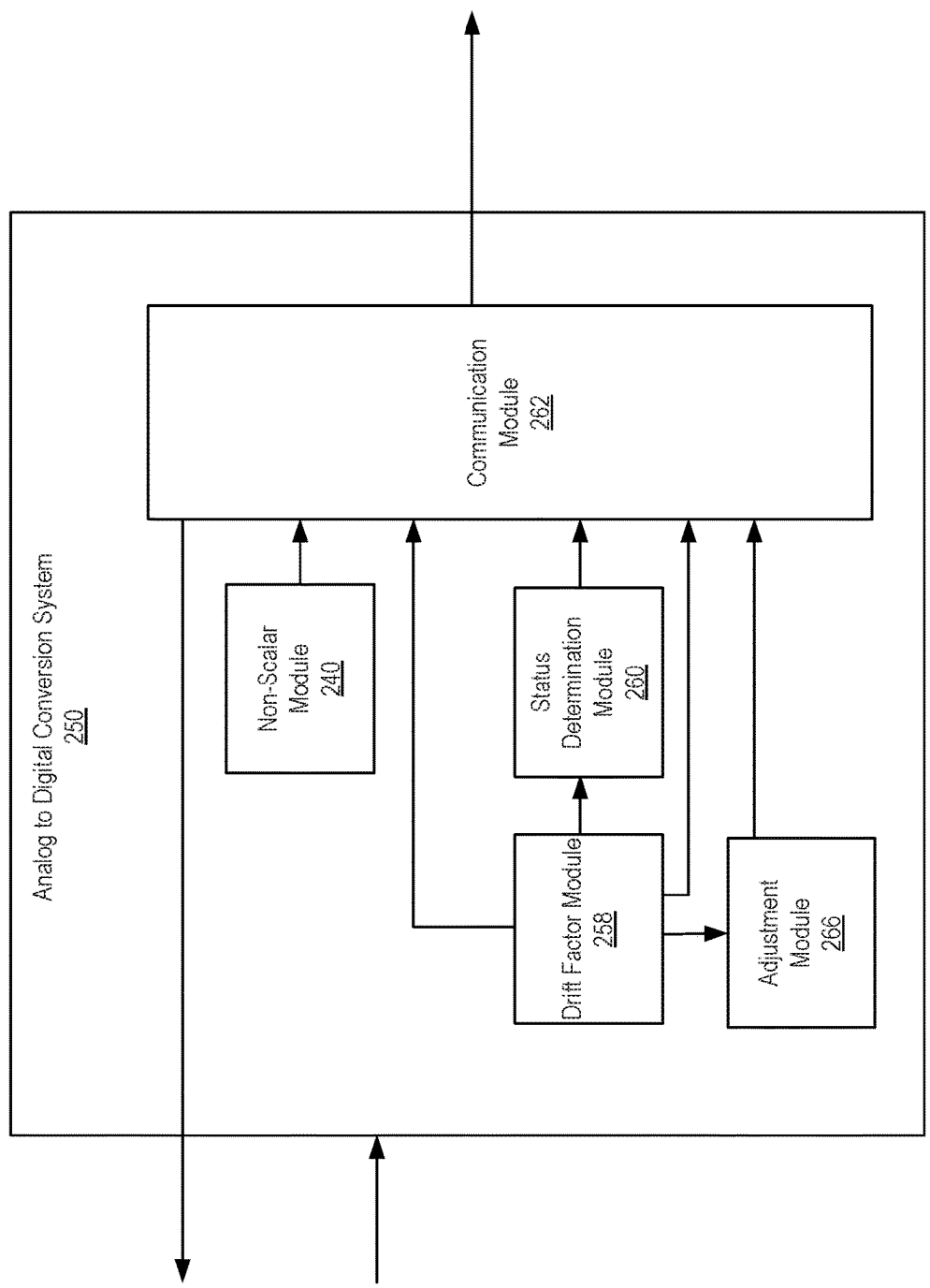
FIG. 2A illustrates an analog to digital conversion system according to one embodiment.

FIG. 2A illustrates an A/D conversion system 250, according to one embodiment. The A/D conversion system 250 may include a non-scalar module 240, a drift factor module 258, a status determination module 260, and/or a communication module 262. The A/D conversion system 250 may also include an adjustment module 266. The functionality of each of these modules is described below with reference to the A/D conversion system 251 of FIG. 2B. FIG. 2A illustrates that the input to the A/D conversion system 250 may not necessarily be connected to the output of an A/D converter providing a N(Vref), as is explicitly shown in FIG. 2B and described below.

Figure 2B:
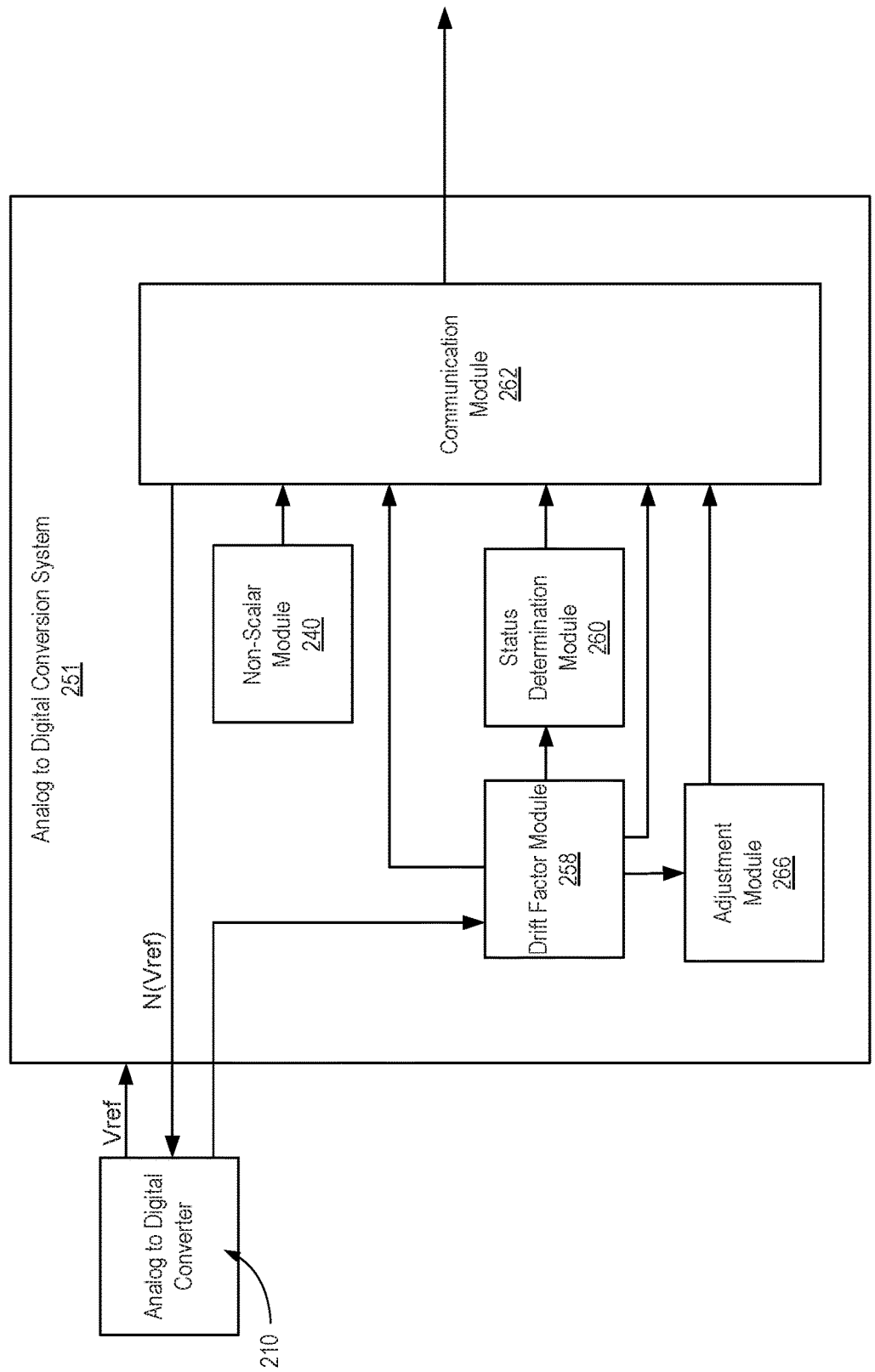
FIG. 2B illustrates an analog to digital conversion system according to one embodiment.

FIG. 2B illustrates an A/D conversion system 251, according to one embodiment of the present disclosure. The A/D conversion system 251 may include a non-scalar module 240, a drift factor module 258, a status determination module 260, and/or a communication module 262. The A/D conversion system 251 may also include an adjustment module 266.

The A/D conversion system 251 may include and/or be in electrical communication with at least one A/D converter 210. The A/D conversion system 251 may receive a reference voltage, $V_{ref}$, from the A/D converter 210. The reference voltage, $V_{ref}$, may drift. For example, the reference voltage, $V_{ref}$, may increase, decrease, and/or otherwise deviate from a calibrated reference voltage, $V_{refCal}$, over time. A change in the reference voltage, $V_{ref}$, may be substantially equal to a drift factor, $\alpha$, and the calibrated reference voltage $V_{refCal}$ may correspond to an expected voltage value of the operating reference voltage, $V_{ref}$, of the A/D converter 210.

More specifically, $V_{refCal}$ may correspond to a particular type, model, and/or configuration of an A/D converter or operating reference voltage, $V_{ref}$. In certain embodiments, $V_{refCal}$ may correspond to an average value of $V_{ref}$, which may be determined prior to deployment of the A/D conversion system 251 and/or the A/D converter 210, or may instead be determined during operation of the A/D converter 210 and/or the A/D conversion system 251.

The non-scalar module 240 may determine a non-scalar function of the reference voltage, $N(V_{ref})$, which may be output to the A/D converter 210. The non-scalar module 240 may determine the non-scalar function of the reference voltage, $N(V_{ref})$, according to a non-scalar and/or non-linear function, $N(x)$, with the operating reference voltage, $V_{ref}$, as an input of the function, $N(x)$.

In one embodiment, the non-scalar function of the reference voltage, $N(V_{ref})$, may correspond to a difference of the reference voltage, $V_{ref}$, and a substantially constant voltage value. In one embodiment, the non-scalar function of the reference voltage, $N(V_{ref})$, may correspond to an exponential or non-linear change of $V_{ref}$ (e.g., squaring, cubing, or similarly changing of the reference voltage, $V_{ref}$). In still other embodiments, the non-scalar function $N(V_{ref})$ may correspond to a logarithm of $V_{ref}$ with any suitable base. Thus, the non-scalar function of the reference voltage, $N(V_{ref})$, may correspond to any suitable function, operation, or other non-scalar and/or non-linear adjustment of the operating reference voltage $V_{ref}$.

The A/D converter may receive and/or measure the non-scalar function of the reference voltage, $N(V_{ref})$, output by the non-scalar module 240, and may output a corresponding digital value, $V_{dig}$, to the A/D conversion system 251, which value may be determined according to Equation 2.

$$V_{dig} = \frac{V_{refCal}}{V_{ref}} N(V_{ref})$$  Equation 2

In certain embodiments, $V_{ref}$ may be approximately equal to $V_{refCAL}$. However, the reference voltage, $V_{ref}$, may drift, scale, increase, or decrease by a drift factor, $\alpha$, relative to $V_{refCAL}$. The drift factor, $\alpha$, may correspond to a ratio of $V_{ref}$ and $V_{refCAL}$, as shown in Equation 3 and Equation 4. Accordingly, if $V_{ref}$ is substantially equal to $V_{refCAL}$, then the drift factor, $\alpha$, may be substantially equal to one.

$$V_{ref} = \alpha V_{refCAL}$$  Equation 3

$$V_{dig} = \frac{N(\alpha V_{ref})}{\alpha}$$  Equation 4

If the reference voltage, $V_{ref}$, is approximately equal to the product of the drift factor and $V_{refCAL}$, the digital value output by the A/D converter $V_{dig}$ may be approximately equal to a digital value of $N(\alpha V_{refCAL})$. More specifically, as $V_{ref}$ deviates according to the drift factor, $\alpha$, from $V_{refCAL}$, the digital output of the one or more A/D converters $V_{dig}$ may likewise deviate according to a non-scalar function of the drift factor, $\alpha$, from $N(V_{refCAL})$.

The A/D converter may measure the non-scalar function of the reference voltage $N(\alpha V_{refCAL})$, even as $V_{ref}$ deviates from $V_{refCAL}$, without losing significant data or information during operation of the A/D conversion system 251 (e.g., as the A/D converter compares the non-scalar function of the reference voltage, $N(V_{ref})$, with the reference voltage, $V_{ref}$). Thus, the A/D converter may output a digital value corresponding to a non-scalar and/or non-linear encoding of $\alpha V_{refCAL}$.

The drift factor module 258 may determine the magnitude of a change in the reference voltage, $V_{ref}$, relative to the calibrated voltage reference, $V_{refCAL}$. In other words, the drift factor module 258 may determine and/or calculate the drift factor, $\alpha$, based on the digital value, $V_{dig}$, output by the A/D converter. More specifically, the drift factor module 258 may determine the drift factor, $\alpha$, by utilizing an inverse of the non-scalar function, $N(x)$, on the digital value, $V_{dig}$. Stated differently, the drift factor, $\alpha$, can be determined according to Equation 5 and Equation 6.

$$F(x) = \frac{N(x * V_{ref})}{x}$$  Equation 5

$$\alpha = F^{-1}(V_{dig})$$  Equation 6

The adjustment module 266 may scale, adjust, and/or compensate for data received by the A/D conversion system 251 in proportion to $\alpha$. The adjustment module 266 may scale the data output by an A/D converter in real time or with substantially minimal delay.

In certain embodiments, the A/D conversion system 251 may store the output of the adjustment module 266 in a computer-readable storage medium. Stored power system data could then be retroactively corrected after a relay failure by adjusting the stored power system data according to the stored output of the adjustment module 266.

The status determination module 260 may determine a status of the reference voltage, $V_{ref}$, by comparing the drift factor, $\alpha$, with a ratio limit or ratio limit value. The communication module 262 may communicate, report, indicate, monitor, store, and/or retrieve the status of the reference voltage, $V_{ref}$, determined by the status determination module 260.

In some embodiments, the communication module 262 may be configured to communicate, read, fetch, and/or report a plurality of statuses associated with the reference voltage, $V_{ref}$, where each status corresponds to a determined period of time.

Figure 3A:
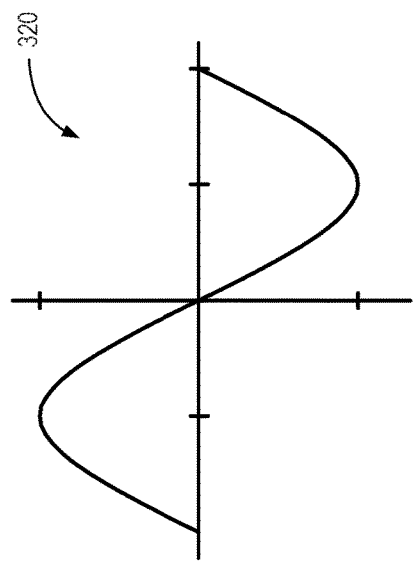
FIG. 3A is a graph of an input to an analog to digital conversion system, according to one embodiment.
Figure 3B:
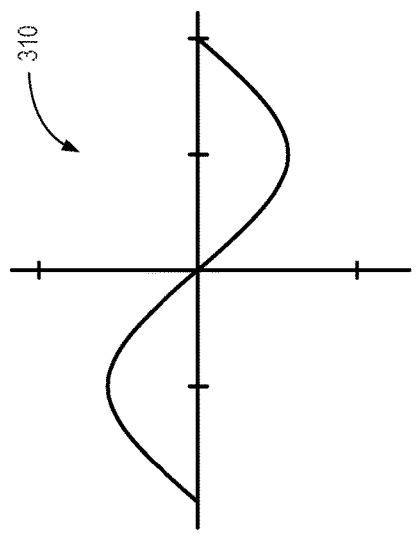
FIG. 3B is a graph of the output of the analog to digital conversion system corresponding to the input of FIG. 3A with a change in a reference voltage.
Figure 3C:
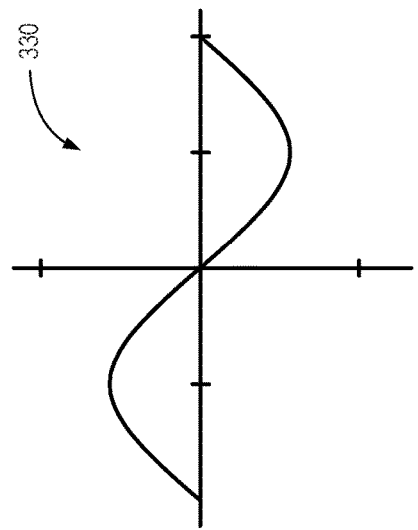
FIG. 3C is a graph of an output of the analog to digital conversion system, scaled according to a drift factor of the reference voltage.

FIG. 3A is a graph 310 of an input to an A/D conversion system, according to the embodiment of FIG. 2. FIG. 3B is a graph 320 of a digital output, $V_{dig}$, of the A/D converter, corresponding to the input of FIG. 3A and a change in a reference voltage of the A/D converter. FIG. 3C is a graph 330 of an output of the A/D converter, which has been adjusted according to the drift factor of the reference voltage, $V_{ref}$ of the A/D converter.

Referring to FIGS. 3A-3C generally and collectively, an A/D converter may inaccurately convert one or more of its inputs when the drift factor, $\alpha$, of the reference voltage, $V_{ref}$, of the A/D converter is substantially greater than or less than one. For example, FIG. 3B shows an inaccurate output of an A/D converter after converting the signal of FIG. 3A. An A/D conversion system may adjust and/or correct inaccurate outputs according to the corresponding drift factor, $\alpha$, to cause the outputs to more accurately represent the corresponding inputs, as shown in FIG. 3C.

Figure 4:
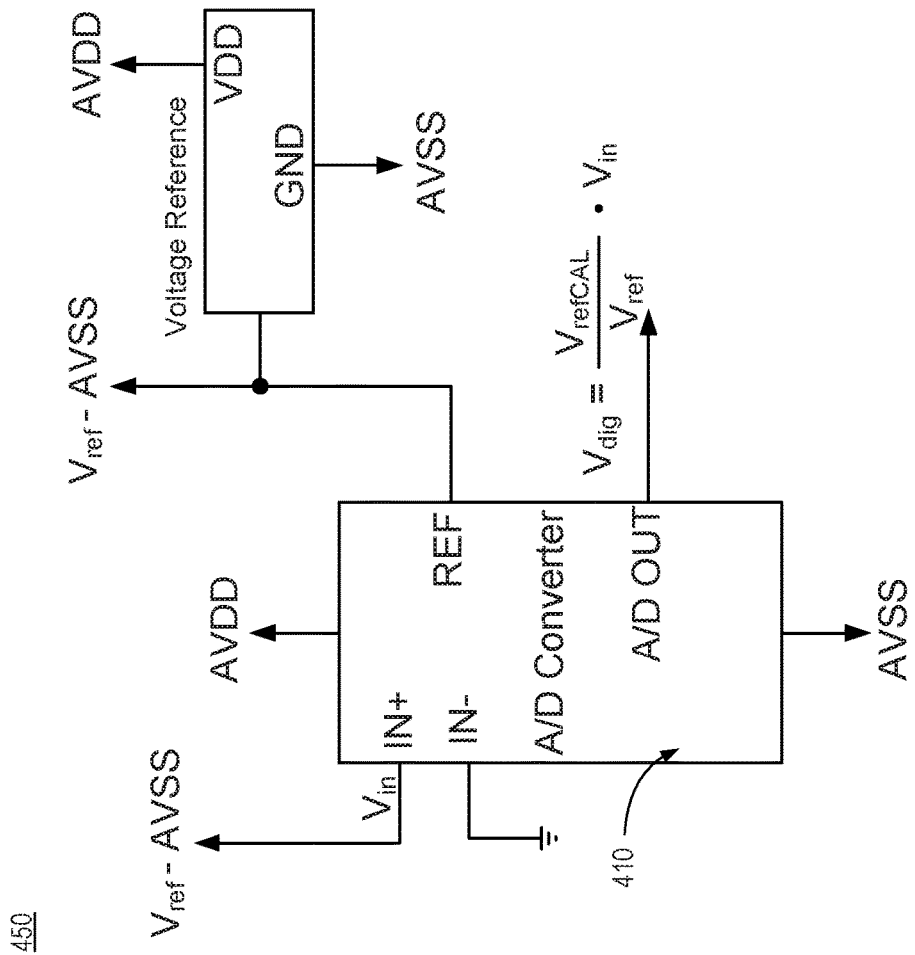
FIG. 4 illustrates an analog to digital conversion system in which an analog to digital converter receives a non-scalar shift of its reference voltage, according to one embodiment.

FIG. 4 illustrates a bipolar capable A/D converter 410 of an A/D conversion system 450. The A/D converter 410 is configured to receive a reference voltage, $V_{ref}$, shifted by a constant value configured as an input to the A/D converter 410, according to one embodiment of the present disclosure. The A/D conversion system 450 of FIG. 4 includes the bipolar capable A/D converter 410 and a non-scalar module.

The non-scalar module may be configured as a bipolar input of the bipolar capable A/D converter 410, and may output the reference voltage, $V_{ref}$, with a shifted or offset value to the bipolar A/D converter 410. The non-scalar module may shift and/or offset the value of the reference voltage, $V_{ref}$, in a non-scalar manner (e.g., by subtracting and/or adding a particular voltage).

Figure 5:
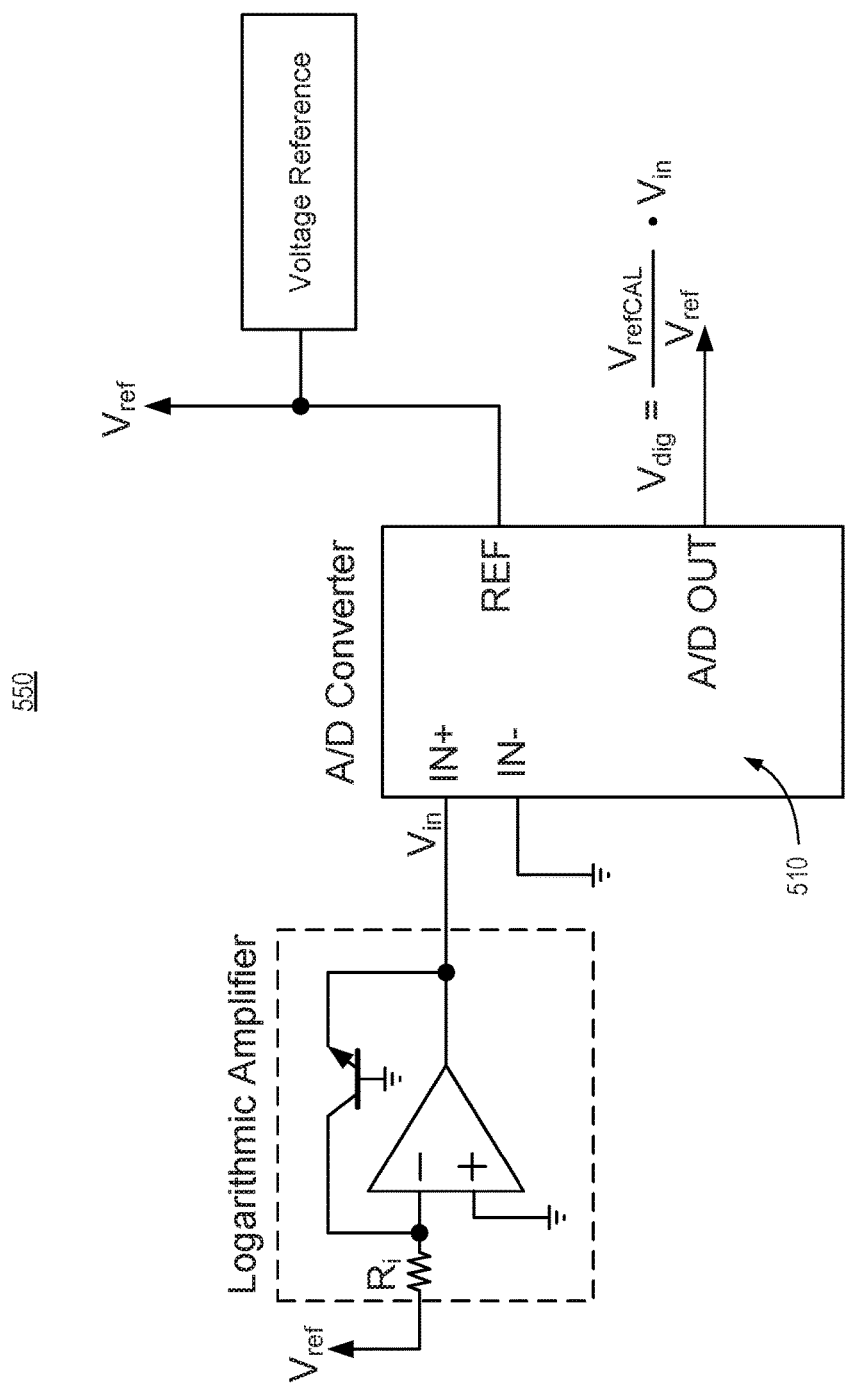
FIG. 5 illustrates an analog to digital conversion system in which an analog to digital converter receives a logarithmic function of its reference voltage, according to one embodiment.

FIG. 5 illustrates an A/D converter 510 of an A/D conversion system 550. The A/D converter 510 is configured to receive a logarithmic function of a reference voltage, $V_{ref}$, according to one embodiment of the present disclosure. The A/D conversion system 550 may include a non-scalar module configured to output a logarithmic function of the reference voltage, $V_{ref}$, of the A/D converter 510.

Figure 6:
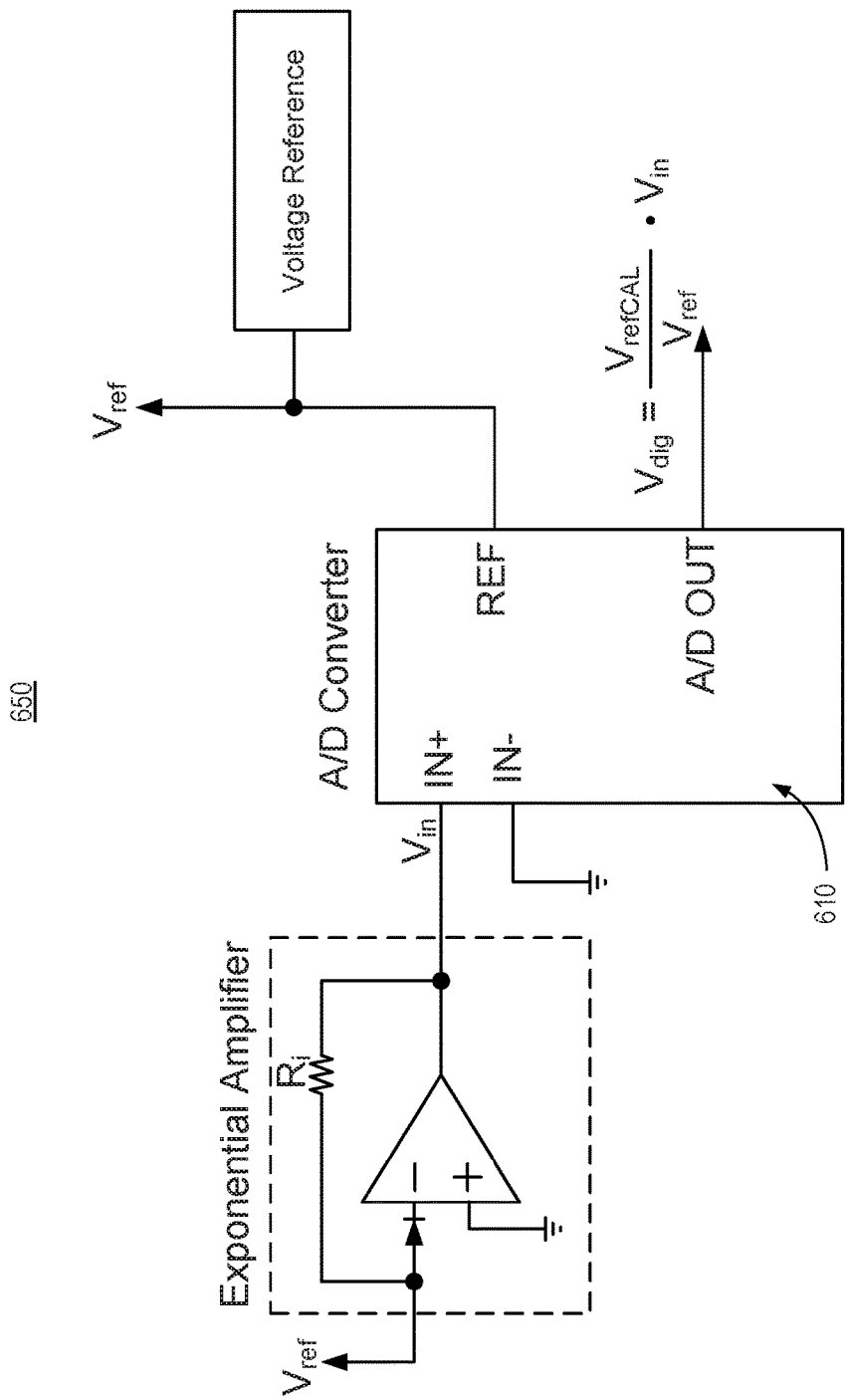
FIG. 6 illustrates an analog to digital conversion system in which an analog to digital converter receives an exponential or logarithmic function of its reference voltage, according to one embodiment.

FIG. 6 illustrates an A/D converter 610 of an A/D conversion system 650. The A/D converter 610 is configured to receive an exponential function of a reference voltage, $V_{ref}$, according to one embodiment of the present disclosure. The A/D conversion system 650 may include a non-scalar module configured to output an exponential function of the reference voltage, $V_{ref}$, of the A/D converter 610.

Figure 7:
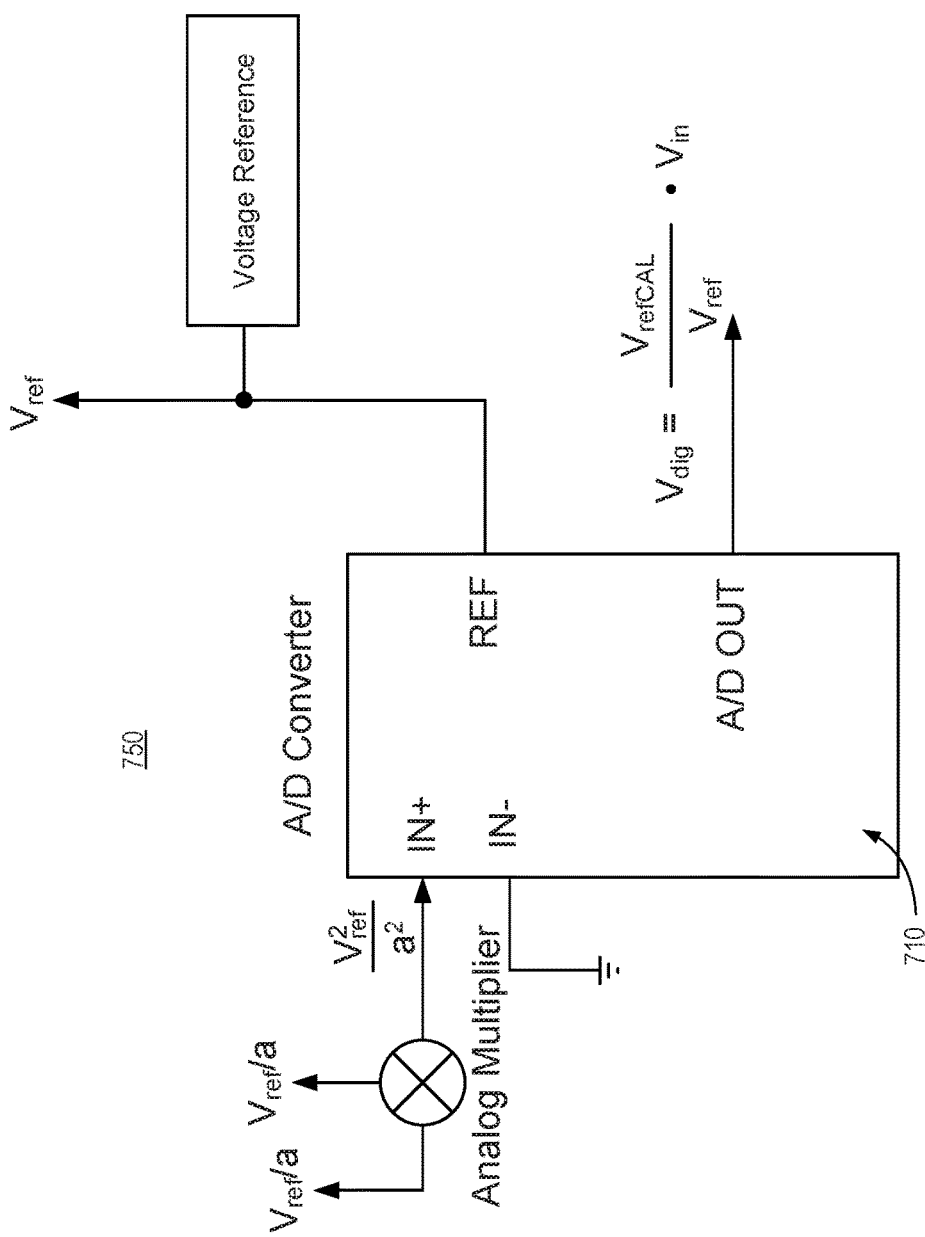
FIG. 7 illustrates an analog to digital conversion system in which an analog to digital converter receives an analog multiplication of its reference voltage, according to one embodiment.

FIG. 7 illustrates an A/D converter 710 of an A/D conversion system 750, the A/D converter 710 configured to receive an analog multiplication of a scaled reference voltage, $V_{ref}$, according to one embodiment of the present disclosure. The A/D conversion system 750 may include a non-scalar module configured to output an analog multiplication of the reference voltage, $V_{ref}$, of the A/D converter 710.

More specifically, the non-scalar module may square the reference voltage, $V_{ref}$. In certain embodiments, the reference voltage, $V_{ref}$, may be scaled by an appropriate scaling factor prior to being received by the non-scalar module. For example, the reference voltage, $V_{ref}$, may be divided by a scaling factor that is greater or less than one, such that the output of the non-scalar module is approximately equal to the square of the reference voltage, $V_{ref}$, divided by the square of the scaling factor, as shown in FIG. 7.

Figure 8:
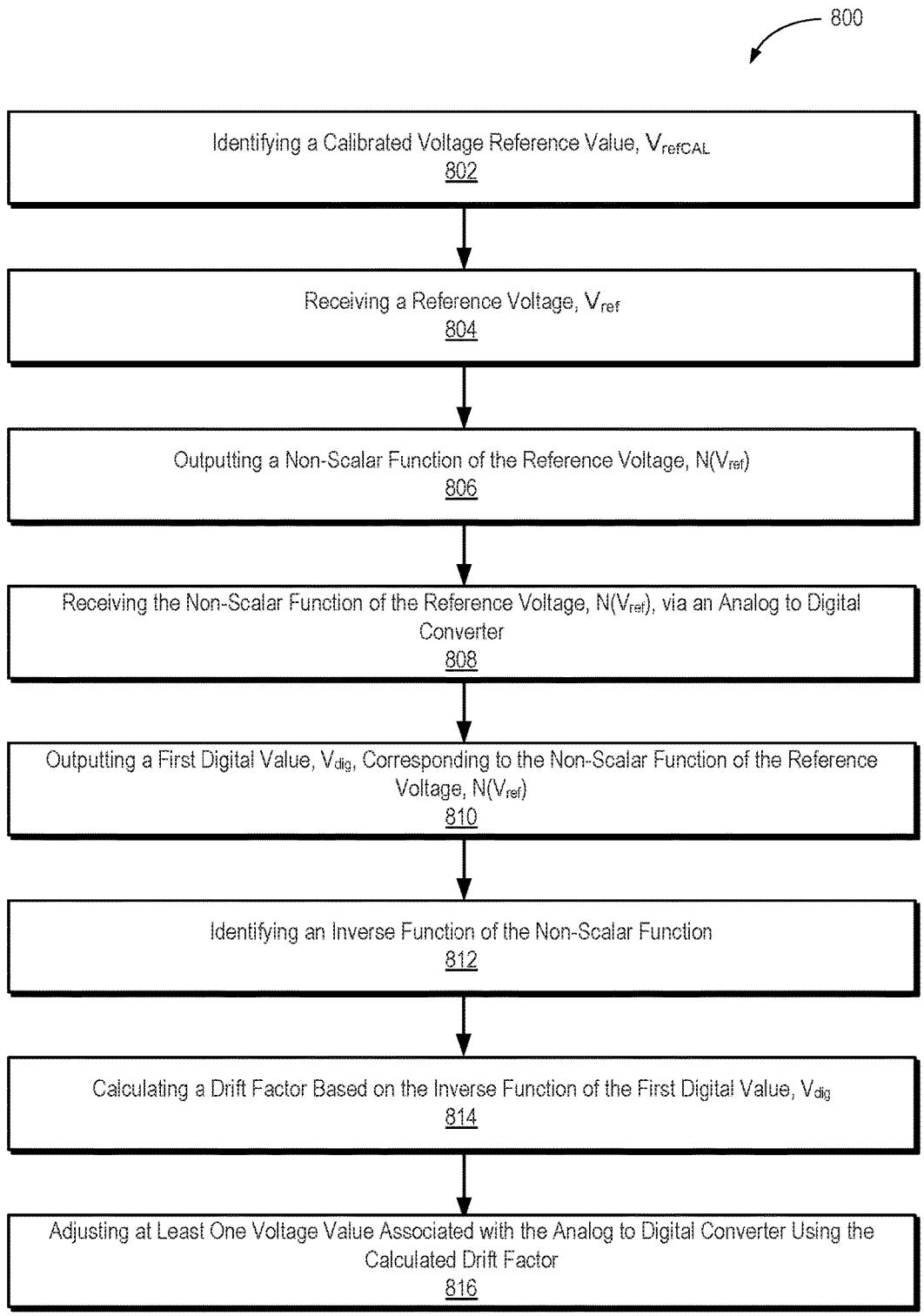
FIG. 8 is a flow chart of a method for determining a change in a reference voltage of an analog to digital converter, according to one embodiment.

FIG. 8 is a flow chart of a method 800 for determining a change in a reference voltage of an A/D converter, according to one embodiment of the present disclosure. The method 800 may include identifying 802 a calibrated voltage reference value, $V_{refCAL}$, associated with an A/D converter, and receiving 804 a reference voltage, $V_{ref}$. The reference voltage, $V_{ref}$, may correspond to the calibrated reference voltage, $V_{refCAL}$, multiplied by a drift factor, $\alpha$, such that $V_{ref} = \alpha V_{refCAL}$.

The method 800 may further include outputting 806, via the non-scalar element, a non-scalar function of the reference voltage, $N(V_{ref})$, and receiving 808 the non-scalar function of the reference voltage, $N(V_{ref})$, via an A/D converter.

Additionally, the method 800 can involve outputting 810, via the A/D converter, a first digital value, $V_{dig}$, where the first digital value corresponds to the non-scalar function of the reference voltage, $N(V_{ref})$. In other words, the first digital value, $V_{dig}$, of the non-scalar function of the reference voltage, $N(V_{ref})$, may correspond to a ratio of the calibrated voltage reference value, $V_{refCAL}$, and the reference voltage, $V_{ref}$. The first digital value, $V_{dig}$, can be expressed as the non-scalar function of the calibrated reference voltage multiplied by the drift factor divided by the drift factor, such that $$V_{dig} = \frac{N(\alpha V_{ref})}{\alpha}.$$

The method 800 may also include identifying 812 an inverse function of the non-scalar function, calculating 814 the drift factor (aka a drift value), $\alpha$, based on the inverse function of the first digital value, $V_{dig}$, and adjusting 816 at least one voltage value associated with the A/D converter using the calculated drift value, $\alpha$.

Figure 9:
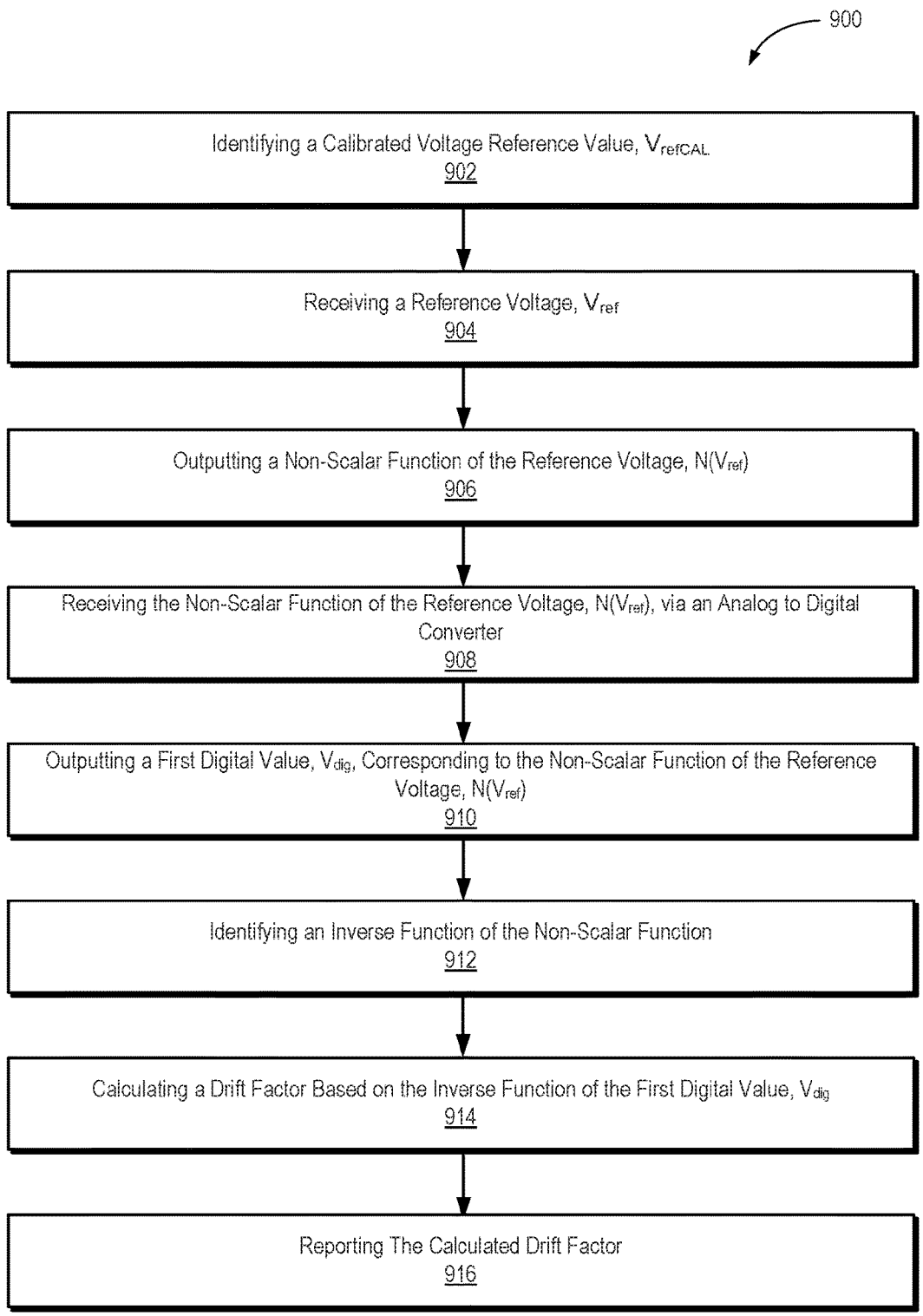
FIG. 9 is another flow chart of a method for determining a change in a reference voltage of an analog to digital converter, according to one embodiment.

FIG. 9 is a flow chart of a method 900 for determining a change in a reference voltage of an A/D converter, according to one embodiment of the present disclosure. The method 900 may include identifying 902 a calibrated voltage reference value, $V_{refCAL}$, associated with an A/D converter, and receiving 904 a reference voltage, $V_{ref}$. The reference voltage, $V_{ref}$, may correspond to the calibrated reference voltage, $V_{refCAL}$, multiplied by a drift factor, $\alpha$, such that $V_{ref} = \alpha V_{refCAL}$.

The method 900 may further include outputting 906, via the non-scalar element, a non-scalar function of the reference voltage, $N(V_{ref})$, and receiving 908 the non-scalar function of the reference voltage, $N(V_{ref})$, via an A/D converter.

Additionally, the method 900 can involve outputting 910, via the A/D converter, a first digital value, $V_{dig}$, where the first digital value corresponds to the non-scalar function of the reference voltage, $N(V_{ref})$. In other words, the first digital value, $V_{dig}$, of the non-scalar function of the reference voltage, $N(V_{ref})$, may correspond to a ratio of the calibrated voltage reference value, $V_{refCAL}$, and the reference voltage, $V_{ref}$. The first digital value, $V_{dig}$, can be expressed as the non-scalar function of the calibrated reference voltage multiplied by the drift factor divided by the drift factor, such that $$V_{dig} = \frac{N(\alpha V_{ref})}{\alpha}.$$

The method 900 may also include identifying 912 an inverse function of the non-scalar function, calculating 914 the drift factor (aka a drift value), α, based on the inverse function of the first digital value, $V_{dig}$, and reporting 916 at least one voltage value associated with the A/D converter using the calculated drift value, α. Alternatively reporting 916 may include reporting that a drift factor has exceeded a threshold value or a threshold value for a certain amount of time.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. The scope of the present invention should, therefore, be determined by the following claims:

What is claimed:

1. An analog to digital (A/D) conversion system, comprising:
   an A/D converter;
   a calibrated reference module to identify a calibrated voltage reference value, $V_{refCAL}$, associated with the A/D converter;
   a non-scalar module to receive a reference voltage, $V_{ref}$, wherein the reference voltage, $V_{ref}$, corresponds to the calibrated reference voltage, $V_{refCAL}$, multiplied by a drift factor, α, such that $V_{ref}=\alpha V_{refCAL}$, and wherein the non-scalar module outputs a non-scalar function of the reference voltage, $N(V_{ref})$, to the A/D converter;
   a drift factor module to identify an inverse function of the non-scalar function and to calculate the drift factor, α, based on an inverse function of a first digital value, $V_{dig}$, output by the A/D converter and corresponding to the non-scalar function of the reference voltage, $N(V_{ref})$, wherein the first digital value, $V_{dig}$, corresponds to a ratio of the calibrated voltage reference value, $V_{refCAL}$, and the reference voltage, $V_{ref}$, such that the first digital value, $V_{dig}$, can be expressed as the non-scalar function of the calibrated reference voltage multiplied by the drift factor divided by the drift factor, such that $$V_{dig} = \frac{N(\alpha V_{ref})}{\alpha};$$

and an adjustment module to adjust at least one voltage value associated with the A/D converter using the calculated drift factor, α.

2. The A/D conversion system of claim 1, wherein the at least one voltage value associated with the A/D converter comprises the reference voltage, $V_{ref}$.

3. The A/D conversion system of claim 1, wherein the at least one voltage value associated with the A/D converter comprises a digital output value corresponding to an input signal received by the A/D converter.

4. The A/D conversion system of claim 1, wherein the at least one voltage value associated with the A/D converter comprises an input signal adjusted prior to reception of the input signal by the A/D converter.

5. The A/D conversion system of claim 1, wherein the A/D converter comprises a bipolar capable A/D converter and wherein the non-scalar module comprises shifting the reference voltage by constant voltage.

6. The A/D conversion system of claim 1, wherein the non-scalar module comprises a logarithmic amplifier.

7. The A/D conversion system of claim 1, wherein the non-scalar module comprises an exponential amplifier.

8. The A/D conversion system of claim 1, wherein the non-scalar module comprises an analog multiplier.

9. The A/D conversion system of claim 1, wherein the non-scalar module comprises a non-linear element and wherein the non-scalar function comprises a non-linear module.

10. A method, comprising:
    identifying a calibrated voltage reference value, $V_{refCAL}$, associated with an analog to digital (A/D) converter;
    receiving, via a non-scalar element, a reference voltage, $V_{ref}$, wherein the reference voltage, $V_{ref}$, corresponds to the calibrated reference voltage, $V_{refCAL}$, multiplied by a drift factor, α, such that $V_{ref}=\alpha V_{refCAL}$;
    generating, via the non-scalar element, a non-scalar function of the reference voltage, $N(V_{ref})$;
    receiving the non-scalar function of the reference voltage, $N(V_{ref})$, via the A/D converter;
    outputting, via the A/D converter, a first digital value, $V_{dig}$, corresponding to the non-scalar function of the reference voltage, $N(V_{ref})$, wherein the first digital value, $V_{dig}$, of the non-scalar function of the reference voltage, $N(V_{ref})$, corresponds to a ratio of the calibrated voltage reference value, $V_{refCAL}$, and the reference voltage, $V_{ref}$, such that the first digital value, $V_{dig}$, can be expressed as the non-scalar function of the calibrated reference voltage multiplied by the drift factor divided by the drift factor, such that $$V_{dig} = \frac{N(\alpha V_{ref})}{\alpha};$$

identifying an inverse function of the non-scalar function;
calculating the drift value, α, based on the inverse function of the first digital value, $V_{dig}$; and
adjusting at least one voltage value associated with the A/D converter using the calculated drift value, α.

11. The method of claim 10, wherein the non-scalar function corresponds to a logarithmic function.

12. The method of claim 10, wherein the non-scalar function corresponds to an exponential function.

13. The method of claim 10, wherein adjusting the at least one voltage value associated with the A/D converter comprises adjusting the reference voltage, $V_{ref}$.

14. The method of claim 10, wherein adjusting the at least one voltage value associated with the A/D converter comprises adjusting a digital output value corresponding to an input signal received by the A/D converter.

15. The method of claim 10, wherein adjusting the at least one voltage value associated with the A/D converter comprises adjusting an input signal prior to reception of the input signal by the A/D converter.

16. The method of claim 10, wherein the A/D converter comprises a bipolar capable A/D converter and wherein the non-scalar element comprises shifting the reference voltage by constant voltage.

17. The method of claim 10, wherein the non-scalar element comprises a logarithmic amplifier.

18. The method of claim 10, wherein the non-scalar element comprises an exponential amplifier.

19. The method of claim 10, wherein the non-scalar element comprises an analog multiplier.

20. The method of claim 10, wherein the non-scalar element comprises a non-linear element and wherein the non-scalar function comprises a non-linear element.

21. A method for reporting a change in a reference voltage of an analog to digital (A/D) converter, comprising:
  determining a calibrated value of a reference voltage of an A/D converter;
  determining a first input of the A/D converter, wherein the first input of the A/D converter is an operating value of the reference voltage of the A/D converter adjusted according to a first non-scalar function;
  comparing the first input of the A/D converter and the calibrated value of the reference voltage of the A/D converter adjusted according to the first non-scalar function; and
  reporting a change in the reference voltage of the A/D converter based on the comparison of the (1) calibrated value and (2) the operating value adjusted by the first non-scalar function.

* * * * *